United States Patent [19]
Ohuchi et al.

[11] Patent Number: 5,969,410
[45] Date of Patent: Oct. 19, 1999

[54] SEMICONDUCTOR IC DEVICE HAVING CHIP SUPPORT ELEMENT AND ELECTRODES ON THE SAME SURFACE

[75] Inventors: Shinji Ohuchi; Hiroshi Kawano; Etsuo Yamada; Yasushi Shiraishi, all of Tokyo, Japan

[73] Assignee: Oki Electric Industry Co., Ltd., Tokyo, Japan

[21] Appl. No.: 08/848,286

[22] Filed: Apr. 29, 1997

[30] Foreign Application Priority Data

May 9, 1996 [JP] Japan ................................. 8-114586
Apr. 17, 1997 [JP] Japan ................................. 9-100083

[51] Int. Cl.$^6$ ........................................... H01G 1/14
[52] U.S. Cl. .................... 257/666; 257/667; 257/676; 257/734; 257/735; 257/783; 257/784; 257/690; 257/692
[58] Field of Search ....................... 257/338, 666, 257/667, 668, 675, 734–738, 780–784, 791, 792, 676, 684, 688, 689, 690, 692

[56] References Cited

U.S. PATENT DOCUMENTS 4,989,117  1/1991  Hernandez ............................. 257/787
5,399,903  3/1995  Rostoker et al. ....................... 257/734

FOREIGN PATENT DOCUMENTS 406097321  4/1994  Japan ..................................... 257/796

Primary Examiner—Fetsum Abraham
Attorney, Agent, or Firm—Jones, Volentine, Steinberg & Whitt, L.L.P.

[57] ABSTRACT

In a plastic packaged semiconductor device, a chip support formed on the same lead frame as leads is disposed so as to extend over the surface of a semiconductor element, the chip support is bonded and fixed to the surface of a polyimide wafer coat on the semiconductor element by means of an insulating tape, the leads are brought into contact with the polyimide wafer coat on the semiconductor element without being fixed, the leads and the electrodes of the semiconductor element are connected by means of gold wires, and these are packaged by a packaging material. Generation of crack in the sealing material thereby prevented, and the thickness of the plastic packaged semiconductor device is reduced.

11 Claims, 7 Drawing Sheets

SEMICONDUCTOR IC DEVICE HAVING CHIP SUPPORT ELEMENT AND ELECTRODES ON THE SAME SURFACE

BACKGROUND OF THE INVENTION

The present invention relates to the structure of a semiconductor device, especially to the structure of a plastic packaged semiconductor device and its fabrication method.

In recent years, in plastic packaged semiconductor devices, with an increased size of a pellet (chip), the dimension between the edge of a package and a semiconductor element tends to be increasingly smaller. This is because, although the semiconductor element has become large in size, the size of a package for housing it has been standardized and cannot be made larger. Accordingly, in order to solve such a problem, a plastic packaged semiconductor device of an LOC (Lead On Chip) structure as disclosed in Japanese Patent Kokoku Publication 6-105721 has come into use.

The plastic packaged semiconductor device of this LOC (Lead On Chip) structure is structured such that leads are bonded to the surface of a semiconductor element via insulating tapes, gold wire platings applied to the top surfaces of the leads and gold balls on the electrodes of the semiconductor element are connected by means of gold wires, and in addition, they are sealed by a resin material.

However, as a major problem with such conventional plastic packaged semiconductor devices, it sometimes happens, for example, that the function is impaired by a crack produced in the resin material due to the heat during the mounting on a board. If the resin becomes moist, having absorbed moisture while the semiconductor device is kept in the air, the moisture is vaporized due to the heat during the mounting on the board, and the force produced from it may bring about the crack. The insulating tape is particularly apt to absorb moisture, so that it often happens that a crack is produced from the area around the insulating tape. Further, as another problem, since there is the insulating tape, the reduction in the thickness of the semiconductor device is subject to a limitation.

SUMMARY OF THE INVENTION

The present invention has been made in view of the above-mentioned problems. It is therefore an object of the present invention to provide a plastic packaged semiconductor device capable of preventing the generation of a crack and being made thinner, and its fabrication method.

The present invention is characterized in that a chip support is provided besides leads, only the chip support is attached to a semiconductor element and the leads are not fixed to a semiconductor element, and the electrodes of the semiconductor element and the leads are connected.

With this configuration, since there is no particular material between the leads and the surface of the semiconductor element for fixing them, the thickness of the combination of the leads and the semiconductor element can be reduced. The thickness of the whole device can be thereby reduced. In addition, since an insulating tape is employed solely for bonding the semiconductor element to the chip support, the area of the insulating tape to be used is very small. Generation of a crack inherent in the insulating tape can be thereby prevented, and the quality can be improved.

DETAILED DESCRIPTION OF THE PREFERRED EMBODIMENTS

First Embodiment

Figure 1:
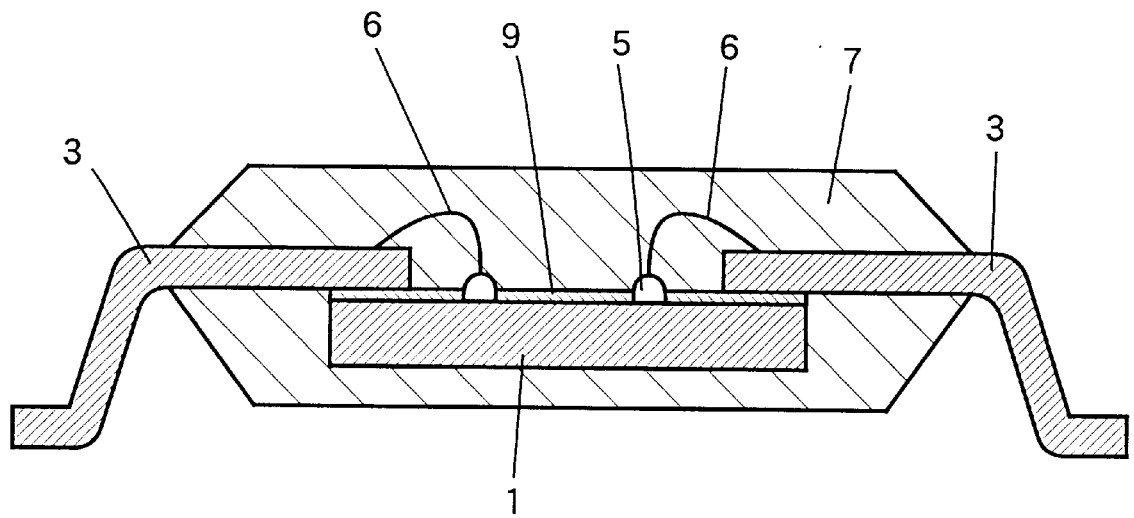
FIG. 1 is an elevational section view showing the structure of the pertinent part of a plastic packaged semiconductor device according to the present invention and the arrangement of leads.
Figure 2:
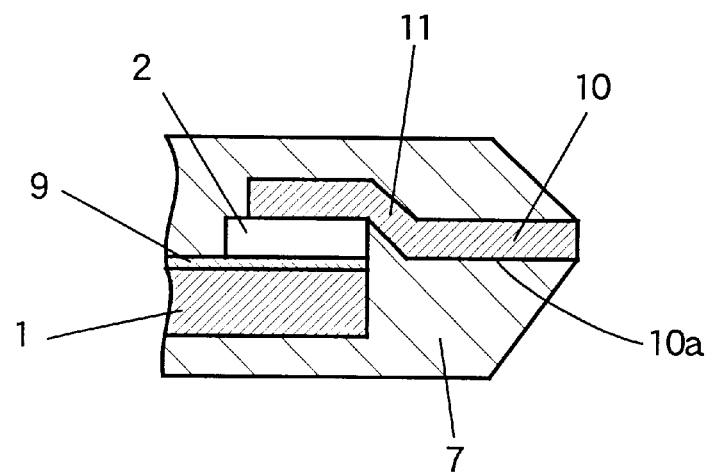
FIG. 2 is an elevational sectional view showing the structure of the pertinent part of the plastic packaged semiconductor device according to the first embodiment of the present invention and the arrangement of a chip support.
Figure 3:
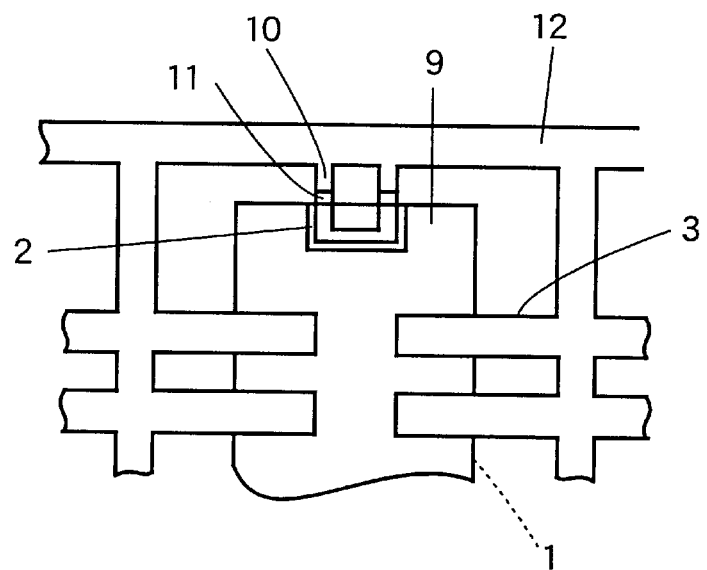
FIG. 3 is a top view showing the plastic packaged semiconductor device according to the first embodiment in the course of its fabrication.

FIGS. 1 and 2 are elevational sectional views showing the structure of the pertinent part of a plastic packaged semiconductor device according to the first embodiment of the present invention. FIG. 1 is a drawing showing the arrangement of leads, and FIG. 2 is a drawing showing the arrangement of chip supports (only one of them being shown). FIG. 3 is a top view showing the plastic packaged semiconductor device according to the first embodiment in the course of its fabrication.

On the circuit-forming surface of a semiconductor element 1, a polyimide wafer coat 9 is provided. This semiconductor element 1 is carried by a lead frame 12 having a thickness of approximately 0.125 mm, including leads 3 and chip supports 10. An insulating tape 2 having a thickness or approximately 0.15 mm is interposed between the chip supports 10 and the semiconductor element 1, and by means of this insulating tape 2, the chip supports 10 and the polyimide wafer coat 9 are bonded and fixed. The chip supports 10 are bent just by substantially the thickness (approximately 0.15 mm) outside the edge of the semiconductor element 1 (at a portion indicated by reference numeral 11 in FIG. 2). In contrast, the leads 3 and the polyimide wafer coat 9 are just in contact with each other, and not fixed. A bottom surface 10*a* of the chip support 10 (outside the bent part 11) and the surface of the polyimide wafer coat 9 are in substantially the same plane. FIG. 3 shows a state in which the semiconductor element 1 is positioned on the lead frame 12 in this way.

Next, gold wire platings (not shown) applied to the top surfaces of the leads 3 and gold balls 5 on the semiconductor element 1 are connected by means of gold wires 6, these are sealed by a resin material 7, and the leads 3 and the chip supports 10 are cut from the lead frame 12. Then, the plastic packaged semiconductor device as shown in FIGS. 1 and 2 is completed.

As described above, in the structure of the plastic packaged semiconductor device according to the first embodiment, the leads 3 and the polyimide wafer coat 9 which forms the surface of the semiconductor element 1 are just in contact, and there is no material between them for fixing these. For this reason, the thickness of the combination of the leads 3 and the semiconductor element 1 can be reduced. The thickness of the whole device can be thereby reduced. The semiconductor device 1 is fixed by means of the insulating tape 2 alone which is adhered to the chip supports 10. Thus, the area of the tape is considerably small. The moisture absorption of the insulating tape 2 can be thereby reduced, and the generation of a crack due to the heat which would be produced during the mounting of a board can be prevented. The quality thus can be improved.

Second Embodiment

Figure 4:
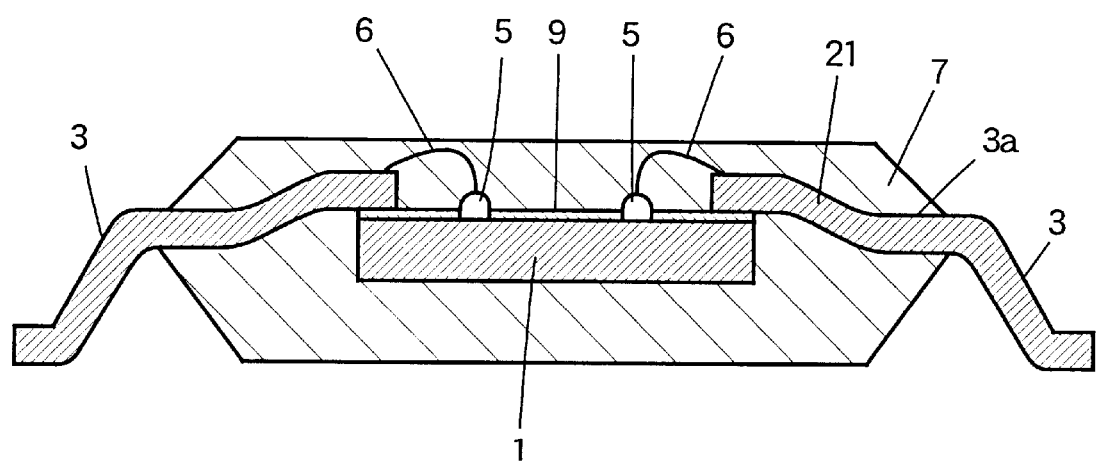
FIG. 4 is an elevational sectional view showing the structure of the pertinent part of a plastic packaged semiconductor device according to the second embodiment of the present invention and the arrangement of leads.
Figure 5:
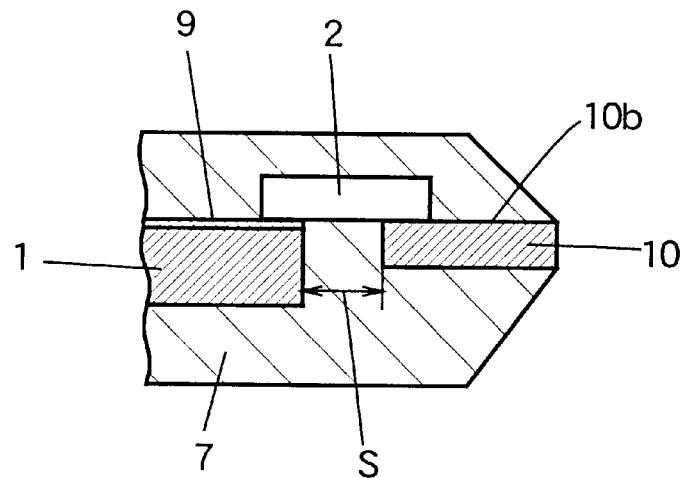
FIG. 5 is an elevational sectional view of the plastic packaged semiconductor device according to the second embodiment of the present invention and the arrangement of a chip support.
Figure 6:
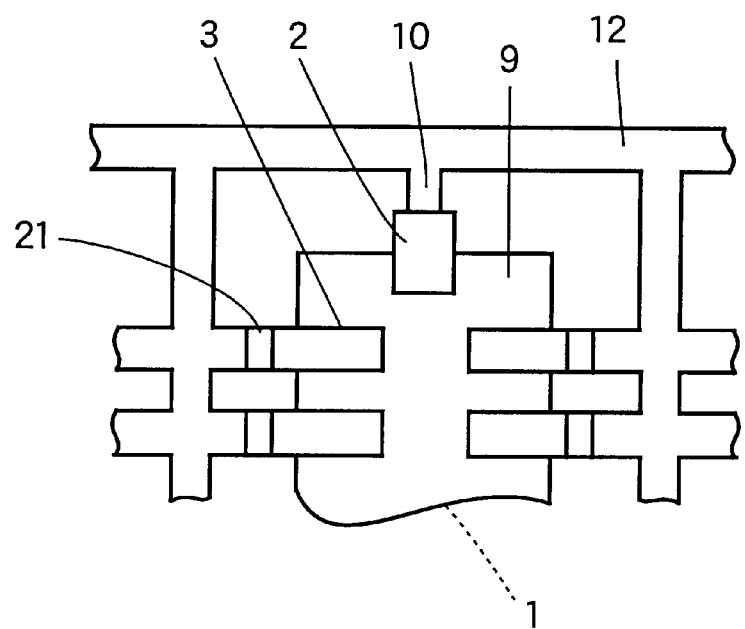
FIG. 6 is a top view showing the plastic packaged semiconductor device according to the second embodiment of the present invention in the course of its fabrication.

FIGS. 4 and 5 are elevational sectional views showing the structure of the pertinent part of a plastic packaged semiconductor device according to the second embodiment of the present invention. FIG. 4 is a drawing showing the arrangement of leads, and FIG. 5 is a drawing showing the arrangement of chip supports (only one of them is shown). FIG. 6 is a top view showing a plastic packaged semiconductor device according to the second embodiment in the course of its fabrication. Referring to FIGS. 4 through 6, the same reference numerals as those in FIGS. 1 through 3 indicate the same or corresponding members.

On the circuit-forming surface of the semiconductor element 1, the polyimide wafer coat 9 is provided. This semiconductor element 1 is carried by the lead frame 12 including the leads 3 and the chip supports 3. The leads 3 and the polyimide wafer coat 9 are just in contact and not fixed. The leads 3 are bent downward (toward the semiconductor element 1) outside the edge of the semiconductor 1 (at a portion indicated by reference numeral 21 in FIG. 4). A top surface 3*a* of each lead 3 (outside the bent portion 21, and disposed within the packaging material 7) and the surface of the polyimide wafer coat 9 are in substantially the same plane. Each chip support 10 is so disposed that its top surface 10*b* is substantially in the same plane as the surface of the polyimide wafer coat 9, and its end is separated by a predetermined clearance 5 from the side edge of the semiconductor element 1. (FIG. 5). In addition, the insulating tape 2 is adhered, bridging the top surface of the polyimide wafer coat 9 and the top surface of the chip support 10, and by means of this insulating tape 2, the polyimide wafer coat 9 and the chip support 10 are bonded and fixed. FIG. 6 shows a state in which the semiconductor element 1 is positioned on the lead frame 12 in this way.

Next, gold wire platings applied to the top surface of the leads 3 (not shown) and the gold balls 5 on the semiconductor element 1 are connected by means of the gold wires 6, these are sealed by the resin material 7, and the leads 3 and the chip supports 10 are cut from the lead frame 12. Then, the plastic packaged semiconductor device as shown in FIGS. 4 and 5 is completed.

As described above, in the structure of the plastic packaged semiconductor device according to the second embodiment, the leads 3 and the polyimide wafer coat 9 which forms the surface of the semiconductor element 1 are just in contact, and there is no material therebetween for fixing these. For this reason, the thickness of the combination of the leads 3 and the semiconductor element 1 can be reduced. The thickness of the whole device can be thereby reduced. In addition, since the semiconductor element 1 is fixed only by means of the insulating tape 2 which is provided to bridging the polyimide wafer coat 9 and the chip support 10, the area of the tape is very small. The moisture absorption of the insulating tape 2 can be thereby reduced, and the generation of a crack during the mounting on the board can be prevented. The quality thus can be improved.

Third Embodiment

Figure 7:
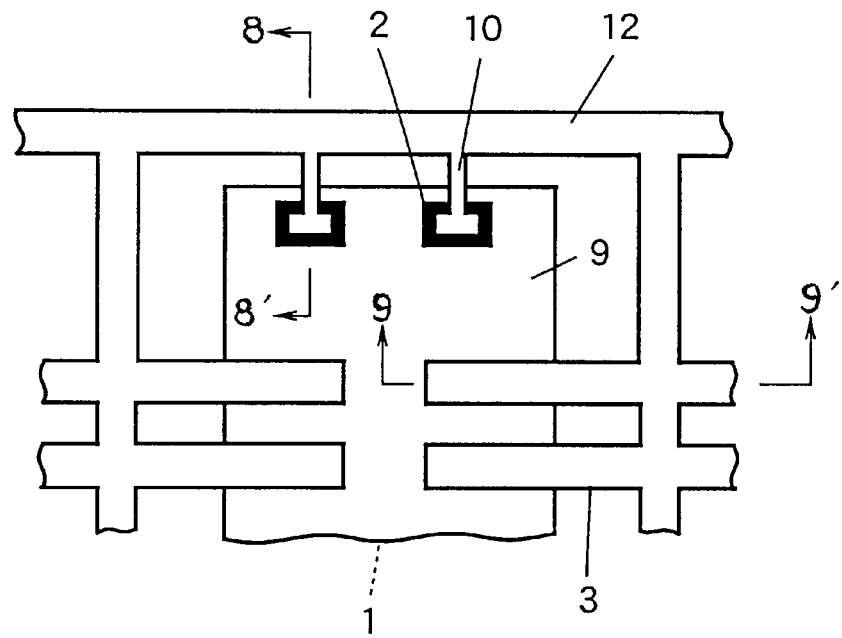
FIG. 7 is a top view showing a plastic packaged semiconductor device according to the third embodiment of the present invention in the course of its fabrication.
Figure 8:
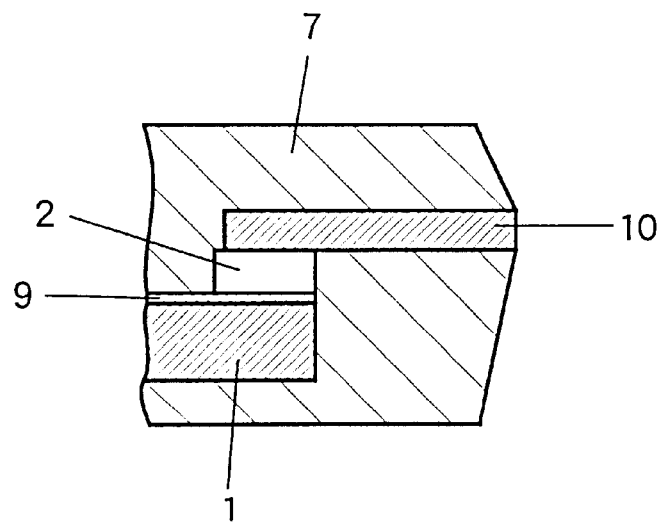
FIG. 8 is an elevational sectional view showing the structure of the essentials of the plastic packaged semiconductor device according to the third embodiment of the present invention, through line A-A' in FIG. 7.
Figure 9:
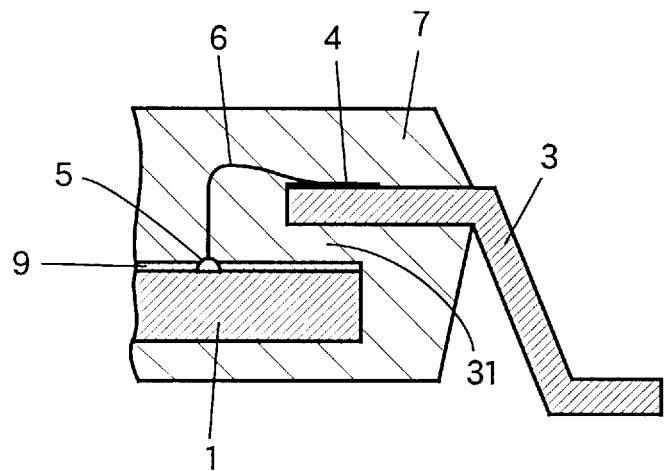
FIG. 9 is an elevational sectional view showing the structure of the essentials of the plastic packaged semiconductor device according to the third embodiment of the present invention, through line B-B' in FIG. 7.

FIGS. 7 through 9 are drawings showing the structure of a plastic packaged semiconductor device according to the third embodiment of the present invention. FIG. 7 is a top view showing the plastic packaged semiconductor device in the course of its fabrication. FIGS. 8 and 9 are elevational sectional views showing the structure of the pertinent part. FIG. 8 is a section along line A-A' in FIG. 7. FIG. 9 is a section alone line B-B' in FIG. 7. Referring to FIGS. 7 through 9, the same reference numerals as those in FIGS. 1 through 6 indicate the same or corresponding members.

The polyimide wafer coat 9 is applied to the circuit-forming surface of the semiconductor element 1. The chip supports 10 are attached to this polyimide wafer coat 9 by means of the insulating tape 2. The chip supports 10 and the leads 3 are formed in substantially the same plane. As shown in FIG. 8, the chip supports 10 are bonded to the surface of the semiconductor element 1 by means of the insulating tape 2. In addition, as shown in FIG. 9, gold wire platings 4 formed on the top surfaces of the leads 3 and the gold balls 5 provided on the electrodes (not shown) of the semiconductor element 1 are connected by means of the gold wires 6, whereby the leads 3 and the electrodes of the semiconductor element 1 are connected. The leads 3 are not bonded to the semiconductor element 1 and are kept apart. That is, the leads 3 are disposed on the semiconductor element 1 with a clearance 31 therebetween, and this clearance 31 is filled with a mold resin 7.

In this way, the insulating tape 2 is not present in the portion below the leads 3, and the insulating tape 2 is employed only for the chip supports 10. For this reason, the amount of the insulating tape 2 used can be reduced considerably, and the moisture absorption thus can be restrained. Further, since the chip supports 10 and the leads 3 are formed in the same plane, the steps of processing the lead frame 12 such as bending can be eliminated.

Figure 10A:
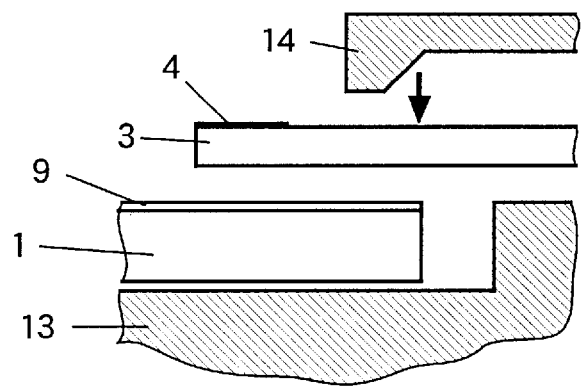
FIGS. 10A and FIG. 10B are drawings showing the process of fabrication of the plastic packaged semiconductor device according to the third embodiment of the present invention.

Next, a method of fabricating the plastic packaged semiconductor device shown in FIGS. 7 through 9 is described with reference to FIG. 10A and FIG. 10B. First, the semiconductor element 1 to which the chip supports 10 of the lead frame 12 have been bonded by means of the insulating tape 2 is disposed within a heat block 13 as shown in FIG. 10A. At this time, in the lead frame 12, the leads 3 and the chip supports 10 are in substantially the same plane, and the leads 3 are in the air, being apart from the semiconductor element 1 just by a thickness of the insulating tape 2 which fixes the chip supports 10 and the semiconductor element 1.

Figure 10B:
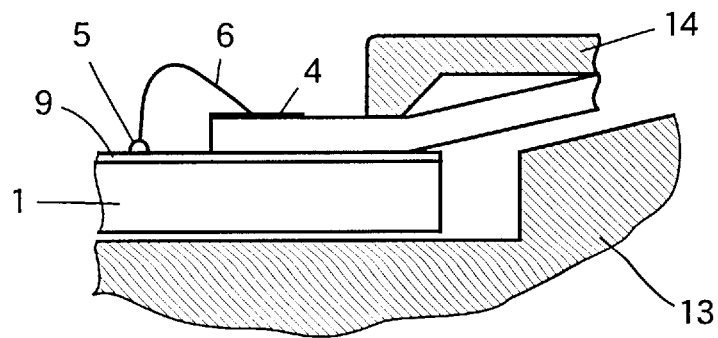

Next, as shown in FIG. 10B, by clamping the leads 3 and the semiconductor element 1 by means of a lead damper 14 disposed on the upper surfaces of the leads 3 and the heat block 13, the leads 3 are brought into contact with the semiconductor element 1. Thereafter, the gold platings 4 of the leads 3 and the gold balls 5 on the semiconductor element 1 are connected by means of wire bonding using the gold wires 6. Then, by releasing the lead damper 14 which has been fixed, the leads 3 return to the position illustrated in FIG. 10A, and the semiconductor element 1, leads 3, gold wires 6, and chip supports 10 are sealed by the resin material 7 in this state (refer to FIGS. 8 and 9). By performing the fabrication in this way, without bending the leads 3 or the chip supports 10, a plastic packaged semiconductor device in which only the chip supports 10 have been fixed to the semiconductor element 1 can be obtained (refer to FIGS. 7 through 9).

Fourth Embodiment

Figure 11:
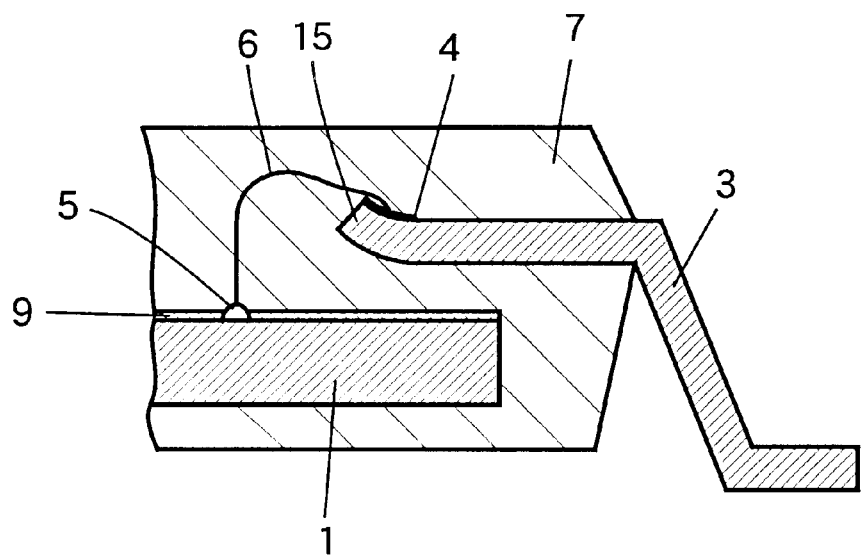
FIG. 11 is an elevational sectional view showing the structure of the essentials of a plastic packaged semiconductor device according to the fourth embodiment of the present invention.
Figure 12:
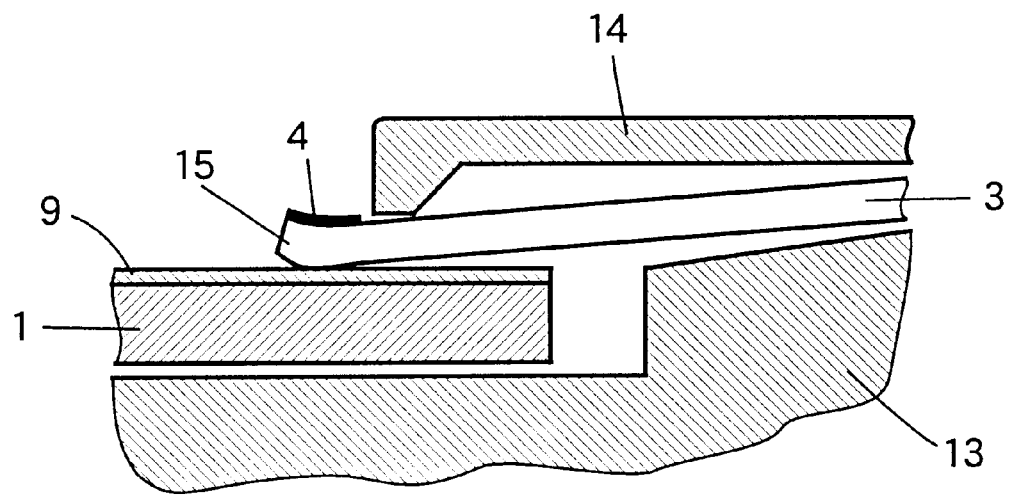
FIG. 12 is a drawing showing the process of fabrication of the plastic packaged semiconductor device according to the fourth embodiment of the present invention.

FIG. 11 is an elevational sectional view showing the structure of the pertinent, parts of a plastic packaged semiconductor device according to the fourth embodiment of the present invention. FIG. 12 shows a method of fabricating the plastic packaged semiconductor device shown in FIG. 11. Referring to FIGS. 11 and 12, the same reference numerals as those in FIGS. 1 through 10 indicate the same or corresponding members.

The plastic packaged semiconductor device according to this fourth embodiment is generally the same as the plastic packaged semiconductor device in the above-mentioned third embodiment, but it is different in the following respects. That is, ends 15 of the leads 3 in the plastic packaged semiconductor device illustrated in FIG. 11 are bent upward away from the surface of the semiconductor element 1. Accordingly, when the lead damper 14 and the heat block 13 clamp the leads 3 and the semiconductor element 1 during the fabrication process, the tips of the leads 3 do riot come in direct contact with the polyimide wafer coat 9 on the semiconductor element 1, and the bottom surfaces of the ends 15 of the leads 3 which have been bent are brought into contact with the polyimide wafer coat 9. For this reason, the generation of a surface flaw on the semiconductor element 1 by the lead 3 can be prevented.

Fifth Embodiment

Figure 13:
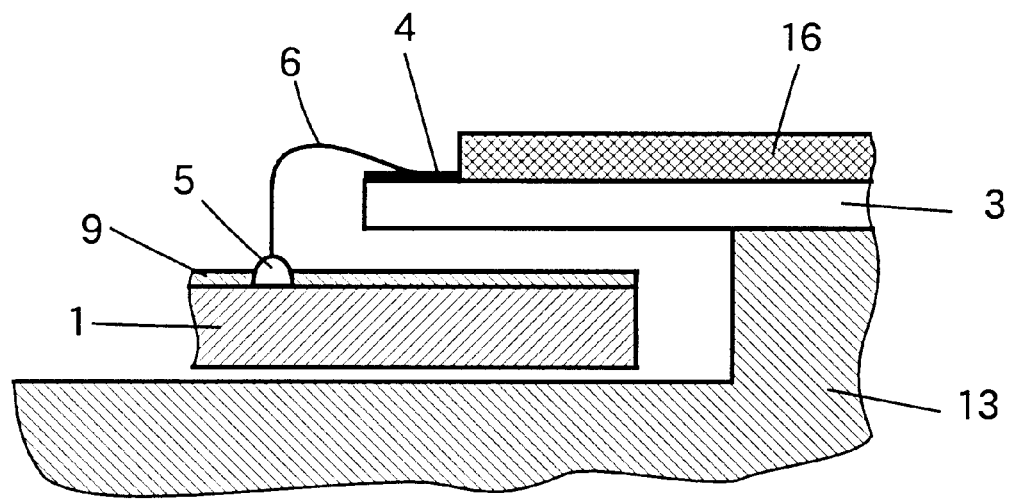
FIG. 13 is a drawing showing the process of fabrication of a plastic packaged semiconductor device according to the fifth embodiment or the present invention.

FIG. 13 shows a method of fabricating a plastic packaged semiconductor device according to the fifth embodiment of the present invention. Referring to FIG. 13, the same reference numerals as those in FIGS. 1 through 12 indicate the same or corresponding members. It is assumed that the structure of the plastic packaged semiconductor device according to this fifth embodiment is the same as that of the plastic packaged semiconductor device according to the above-mentioned third embodiment.

In the fabrication process of this plastic packaged semiconductor device according to this fifth embodiment, the gold wire platings 4 on the leads 3 and the gold balls 5 on the semiconductor element 1 are connected, using the lead damper 16 containing an electromagnet, without bringing the leads 3 into contact with the surface of the semiconductor element 1. Referring to FIG. 13, the semiconductor element 1 to which the chip supports 10 have been attached by means of the insulating tape 2 is first disposed within the heat block 13. At this point in time, the leads 3 are in the air, being apart, from the semiconductor element 1 by the thickness of the insulating tape 2 which bonds the chip supports 10 to the semiconductor element 1.

Next, the lead clamper 16 containing the electromagnet is disposed on the top surfaces of the leads 3, and by means of a magnetic force of the lead damper 16 containing the electromagnet, the leads 3 are fixed to the bottom surface of the lead damper 16 containing the electromagnet, and in this state the leads 3 and the gold balls 5 on the semiconductor element 1 are subject to wire bonding by means of the gold wires 6. By connecting the gold balls 5 and the leads 3 in this way, a surface flaw on the semiconductor element 1 and deformation of the lead 3 can be prevented.

The fabrication method according to the fifth embodiment may also be applied in the plastic packaged semiconductor device according to the above-mentioned fourth embodiment.

Sixth Embodiment

Figure 14:
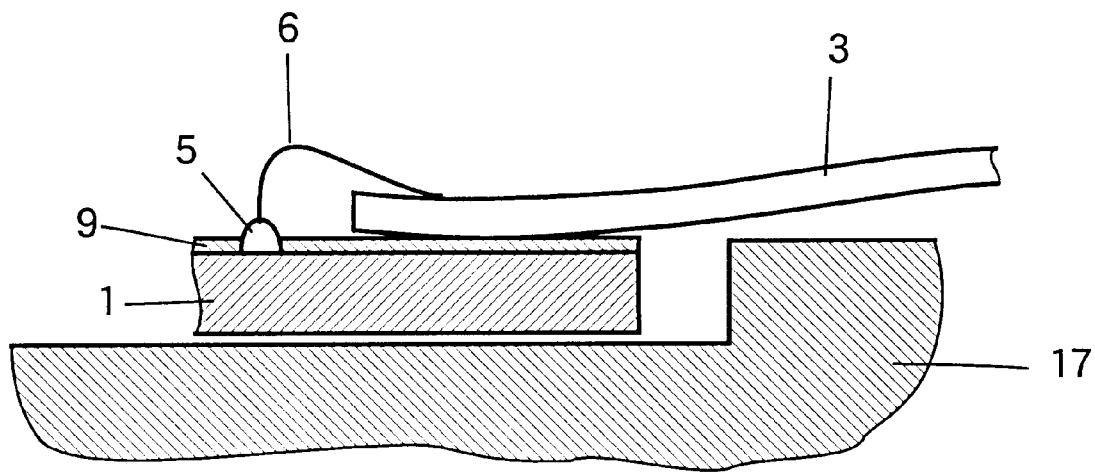
FIG. 14 is a drawing showing the process of fabrication of a plastic packaged semiconductor device according to the sixth embodiment of the present invention.

FIG. 14 shows a method of fabricating a plastic packaged semiconductor device according to the sixth embodiment of the present invention. Referring to FIG. 14, the same reference numerals as those in FIGS. 1 through 13 indicate the same or corresponding members. It is assumed that the structure of the plastic packaged semiconductor device according to this sixth embodiment is the same as that of the plastic packaged semiconductor device according to the above-mentioned third embodiment shown in FIGS. 7 through 9.

In the fabrication process of the plastic packaged semiconductor device according to this sixth embodiment, the leads 3 are brought into contact with the surface of the semiconductor element 1, using a heat block 17 containing an electromagnet. Referring to FIG. 14, the semiconductor element 1 to which the chip supports 10 have been attached by means of the insulating tape 2 is first disposed within the heat block 17 containing the electromagnet. Next, the heat block 17 containing the electromagnet is operated, and by means of this magnetic force, the leads 3 are pulled toward the surface of the semiconductor element 1 and brought into contact with it. In this state, the gold balls 5 and the leads 3 are connected by using the gold wires 6. By connecting the gold balls 5 and the leads 3 in this way, the leads 3 can be fixed stably without the use of a lead clamper.

The fabrication method according to the sixth embodiment may also be applied in the plastic packaged semiconductor device according to the above-mentioned fourth embodiment shown in FIG. 11.

As described above, according to a semiconductor device and its fabrication method of the present invention, the entire semiconductor device can be made thinner. In addition, the generation of a crack inherent in an insulating tape for bonding can be prevented, and the quality thus can be improved.

What is claimed is:

1. A semiconductor device comprising:

a semiconductor element having electrodes on a principal surface thereof;

leads connected with the electrodes; and a chip support extending on said principal surface of the semiconductor element; and an insulating tape provided between the chip support and the semiconductor element for attaching the chip support to the semiconductor element.

2. The semiconductor device as set forth in claim 1, wherein the chip support is bent toward the semiconductor element outside an edge of the semiconductor element just by substantially the thickness of the insulating tape.

3. The semiconductor device as set forth claim 1, wherein the leads and the electrodes are connected by wire bonding.

4. The semiconductor device according to claim 1, further comprising a polyimide layer between the leads and the semiconductor element.

5. The semiconductor device according to claim 1, wherein the leads and the chip support are extensions of a same one-piece lead frame.

6. A semiconductor device comprising:

a semiconductor element having electrodes on a principal surface thereof;

leads connected with the electrodes;

a chip support, an upper surface of which is disposed outside an edge of the semiconductor element to be substantially in a same plane as said principal surface of the semiconductor element; and the leads are bent toward the semiconductor element outside the edge of the semiconductor element.

7. A semiconductor device comprising:

a semiconductor element having electrodes on a principal surface thereof;

leads disposed, being apart from said principal surface of the semiconductor element;

a chip support attached to said principal surface of the semiconductor element, and disposed substantially in a same plane as the leads; and wires for connecting the electrodes and the leads.

8. The semiconductor device according to claim 7, wherein the leads and the chip support are extensions of a same one-piece lead frame.

9. The semiconductor device according to claim 7, wherein the chip support is attached to said principal surface of the semiconductor element by an insulating tape.

10. A semiconductor device comprising:

a semiconductor element having electrodes on a principal surface thereof;

a plurality of leads each connected with the electrodes; and a chip support fixed on said principal surface of the semiconductor element by an insulating tape.

11. The semiconductor device according to claim 10, wherein said chip support has a bent portion and an extending portion extending away from said semiconductor element, and wherein a bottom surface of the extended portion of the chip support and said principal surface of the semiconductor element are in substantially a same plane.

* * * * *